United States Patent
Lin et al.

(10) Patent No.: US 6,797,984 B1
(45) Date of Patent: Sep. 28, 2004

(54) LIGHT-EMITTING DIODE PACKAGING STRUCTURE HAVING RECTIFICATION CIRCUIT

(75) Inventors: Ming-Te Lin, Taipei Hsien (TW); Ming-Yao Lin, Panchiao (TW)

(73) Assignee: Para Light Electronics Co., Ltd., Taipei (TW)

( * ) Notice: Subject to any disclaimer, the term of this patent is extended or adjusted under 35 U.S.C. 154(b) by 0 days.

(21) Appl. No.: 10/658,330

(22) Filed: Sep. 10, 2003

(51) Int. Cl.[7] .............................................. H01L 31/12
(52) U.S. Cl. .......................... 257/82; 257/119; 438/109
(58) Field of Search .................... 257/79–84, 119–122, 257/502, 601, 683; 438/30, 78, 109

(56) References Cited

U.S. PATENT DOCUMENTS

2004/0004446 A1 * 1/2004 Liu .............................. 315/224

* cited by examiner

*Primary Examiner*—Matthew Smith
*Assistant Examiner*—Calvin Lee
(74) *Attorney, Agent, or Firm*—Troxell Law Office PLLC

(57) ABSTRACT

A light emitting diode (LED) packaging structure with built-in rectification circuit is disclosed. The LED packaging structure includes an LED and a rectification circuit is formed inside the LED. Thus, the LED packaging structure is capable to receive an alternate current from an electrical main by the rectification circuit which converts the alternate current into a direct current for the LED whereby the LED can be directly connected to the electrical main and powered thereby without use of additional and external rectification device.

4 Claims, 7 Drawing Sheets

LIGHT-EMITTING DIODE PACKAGING STRUCTURE HAVING RECTIFICATION CIRCUIT

FIELD OF THE INVENTION

The present invention generally relates to the filed of light-emitting diodes (LEDs), and in particular to an LED packaging structure incorporating a rectification circuit that converts an alternate current from an electrical main into a direct current to be supplied to the LED whereby the LED device of the present invention can be directly powered by the alternate current of the electrical main without use of external rectifiers.

BACKGROUND OF THE INVENTION

A light-emitting diode (LED) is powered by a direct current of 2–4 volts. When the light-emitting diode is to be powered by an electrical main, which usually supplies an alternate current of 110 volts or 220 volts, rectification and regulation means are required to convert and supply the alternate current of the electrical main into the direct current for the light-emitting diode. Conventionally, the rectification and regulation means are made in circuit form additionally connected to the light-emitting diode. In other words, the conventional light emitting diode device does not have built-in rectification and regulation means.

Referring to FIG. 8 of the attached drawings, a lighting device comprised of a number of LED units is shown. The lighting device, which is generally designated with reference numeral 9, comprises a number of LED units 90 mounted on a common circuit board 91, a regulation device 92 and a rectification device 93 electrically connected between the circuit board 91 and external contacts (not labeled) of the lighting device for receiving and converting an alternate current of an electrical main (not shown) into a direct current for the LED units 90. The alternate current from the electrical main is supplied to the lighting device 9 via the contacts thereof. The alternate current is processed by the rectification device 93 and the regulation device 92 and then applied to the circuit board 91 for powering the LED units 90. A casing 94 houses all the electrical parts, including the LED units 90 mounted on the circuit board 91, the rectification device 93 and the regulation device 92.

An illustrative example of the circuit of the lighting device 9 is shown in FIG. 9.

The lighting device 9 is comprised of a number of single LED units 90 for enhancing overall brightness and thus realizing general illumination. However, since the LED units 90, which have a conventional structure, cannot be directly powered by the electrical main and rectification and regulation of power from the electrical main is required for the conventional LED based devices. This inevitably increases the overall size of the LED based device. Power consumption is increased also. Further, independently manufacturing and assembling separate parts, such as the regulation device, the rectification device and the circuit board and the LED units to form the LED based device is generally costly.

SUMMARY OF THE INVENTION

Thus, a primary object of the present invention is to provide an LED packaging structure that comprises a built-in rectification device for conversion of an alternate current from an electrical main into a direct current for LED whereby an LED device comprised of the LED packaging structure can be directly powered by the electrical main without external rectification and regulation devices.

To achieve the above object, in accordance with one aspect of the present invention, a light-emitting diode (LED) packaging structure comprises a light emitting diode comprising a frame and a packaging portion packaging a portion of the frame, the frame comprising a primary support and first and second subsidiary supports on opposite sides of the primary support, a light-emitting chip having positive and negative poles being formed on the primary support; and a rectification circuit comprised of diodes of low power high voltage construction, the diodes being formed on the first and second subsidiary supports respectively and electrically connected to the positive and negative poles of the light-emitting chip by leads.

In another aspect of the present invention, a light-emitting diode (LED) packaging structure comprises a light emitting diode comprising a frame and a packaging portion packaging a portion of the frame, the frame comprising a primary support and first and second subsidiary supports on opposite sides of the primary support, a substrate having pre-defined positive and negative electrodes being formed on the primary support and a light-emitting chip having positive and negative poles being formed on the substrate with the positive and negative poles of the light-emitting chip corresponding to and connected to the positive and negative electrodes of the substrate; and a rectification circuit comprised of diodes of low power high voltage construction, the diodes being formed on the substrate and electrically connected to the first and second subsidiary supports respectively by leads.

As such, the rectification device internally built in the LED packaging structure of the present invention allows for conversion of the alternate current from the electrical main into the direct current that can be directly supplied to the LED cell whereby an LED based device that is comprised of the LED packaging structure of the present invention can be directly powered by the electrical main without additional and external power regulation and rectification devices.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

Figure 1:
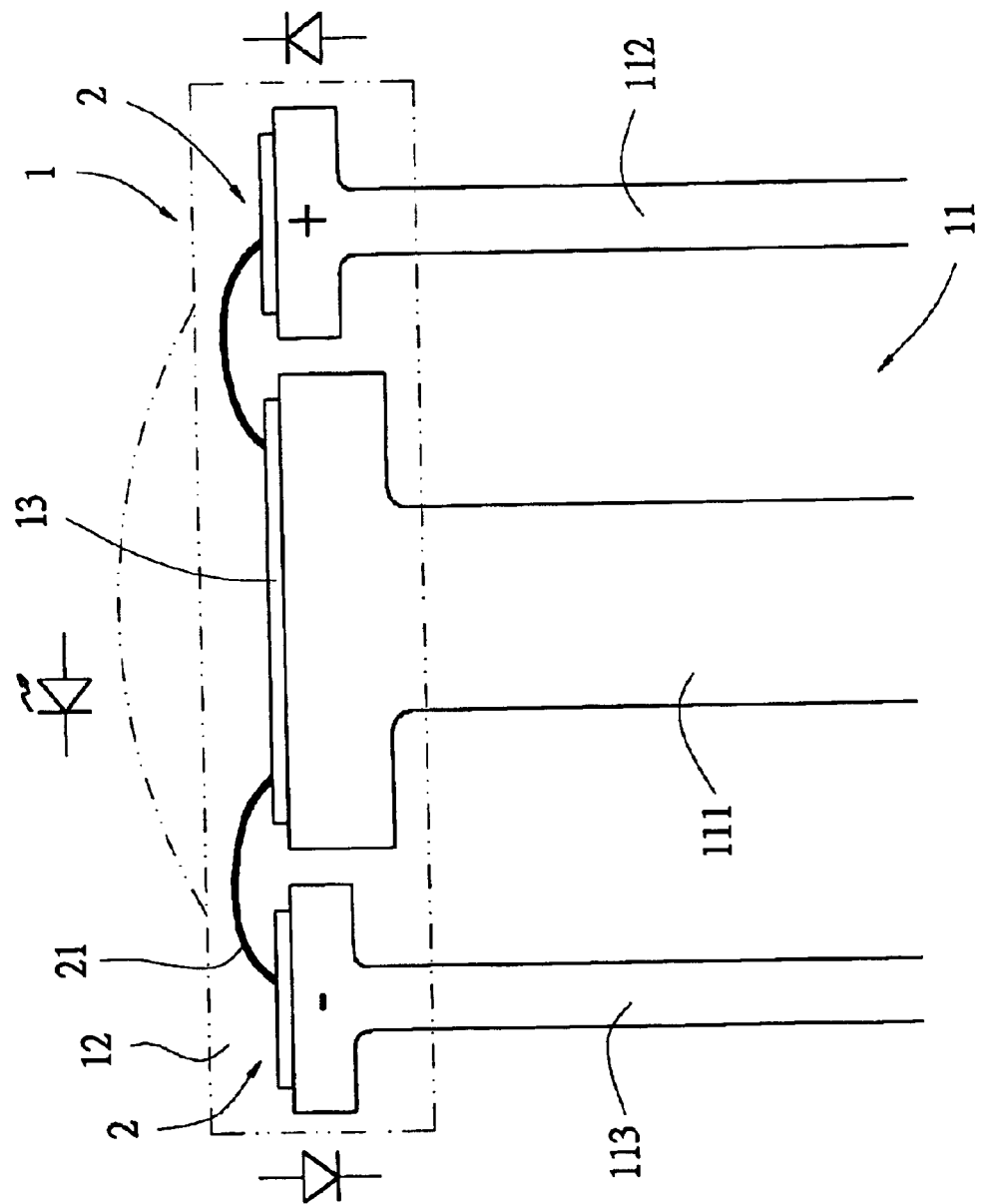
FIG. 1 schematically shows a light-emitting diode (LED) packaging structure in accordance with the present invention.

With reference to the drawings and in particular to FIG. 1, a light emitting diode (LED) packaging structure in accordance with the present invention comprises an LED 1 and a rectification circuit 2 formed inside the LED 1 whereby the LED 1 comprises a built-in rectification circuit 2. The rectification circuit 2 receives an alternate circuit from for example a wall outlet of an electrical main and supplies a direct current to the LED 1 for powering and thus lighting the LED 1. Thus, the LED device of the present invention can be directly powered by the electrical main without additional rectification and regulation devices.

The LED 1 comprises a frame 11 and a packaging portion 12 wrapping a portion of the frame 11. The frame 11 is comprised of a primary support 111 and first and second subsidiary supports 112, 113 located on opposite sides of the primary support 111. A light-emitting chip 13 having positive and negative poles is formed on the primary support 111. The light-emitting chip 13 is generally powered with 110 volts and the rating voltage of the LED is 100–107V.

Figure 2:
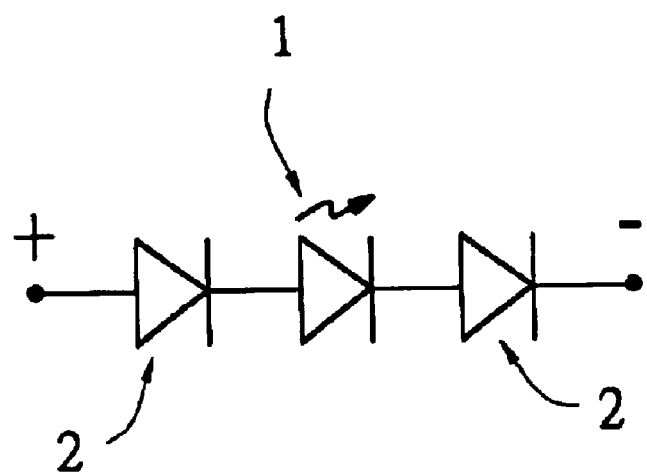
FIG. 2 shows a rectification circuit of the LED packaging structure of the present invention.

The rectification circuit 2 is comprised of diodes that are low power, high voltage diodes. For example, the diodes are what can be operated with 10–50 mA and Vf=0.1–0.7V and Vr=250V. The diodes are respectively mounted on the first and second subsidiary supports 112, 113 and are connected to the positive and negative poles of the light-emitting chip 13 by leads 21. A circuit diagram of the rectification circuit 2 is shown in FIG. 2. Thus, a novel LED packaging structure is formed with the above discussed arrangement.

Figure 3:
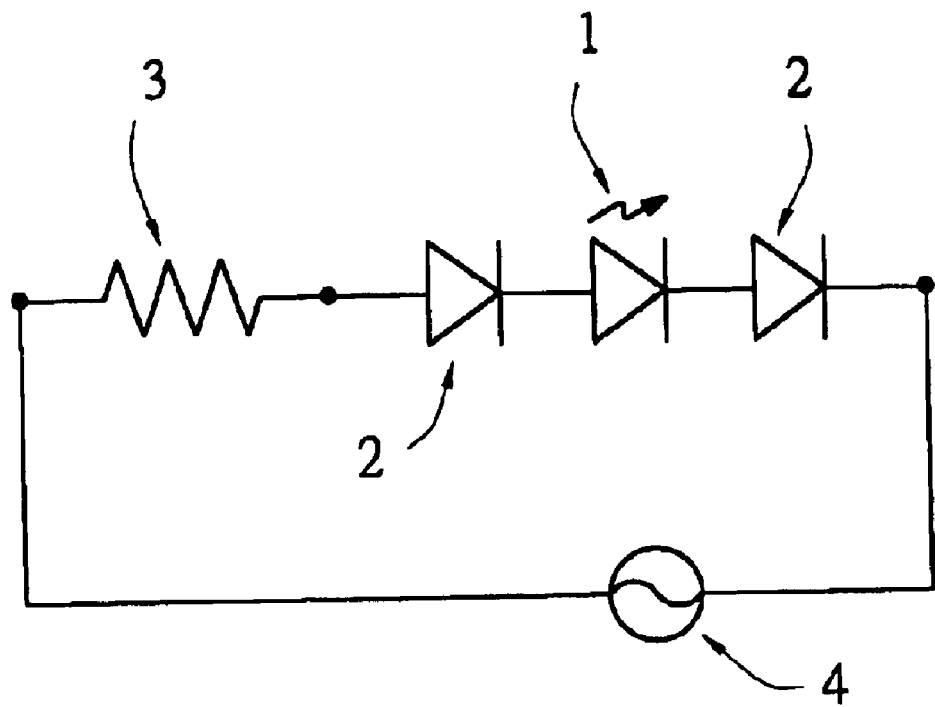
FIG. 3 shows a circuit diagram of an application of the LED packaging structure of the present invention.

In a practical application, as illustrated in FIG. 3, the LED packaging structure of the present invention that is comprised of the LED 1 and the rectification circuit 2 is connected in series with a resistor 3 for regulation of an electrical current flowing through the LED 1. The LED packaging structure can be directly connected to an electrical main 4, such as a wall outlet. The rectification circuit 2, together with the resistor 3, receives and converts an alternate current from the electrical main 4 into a direct current for the LED 1. The LED 1 can thus be lighted by the electrical main 4 directly without external rectification device.

Figure 4:
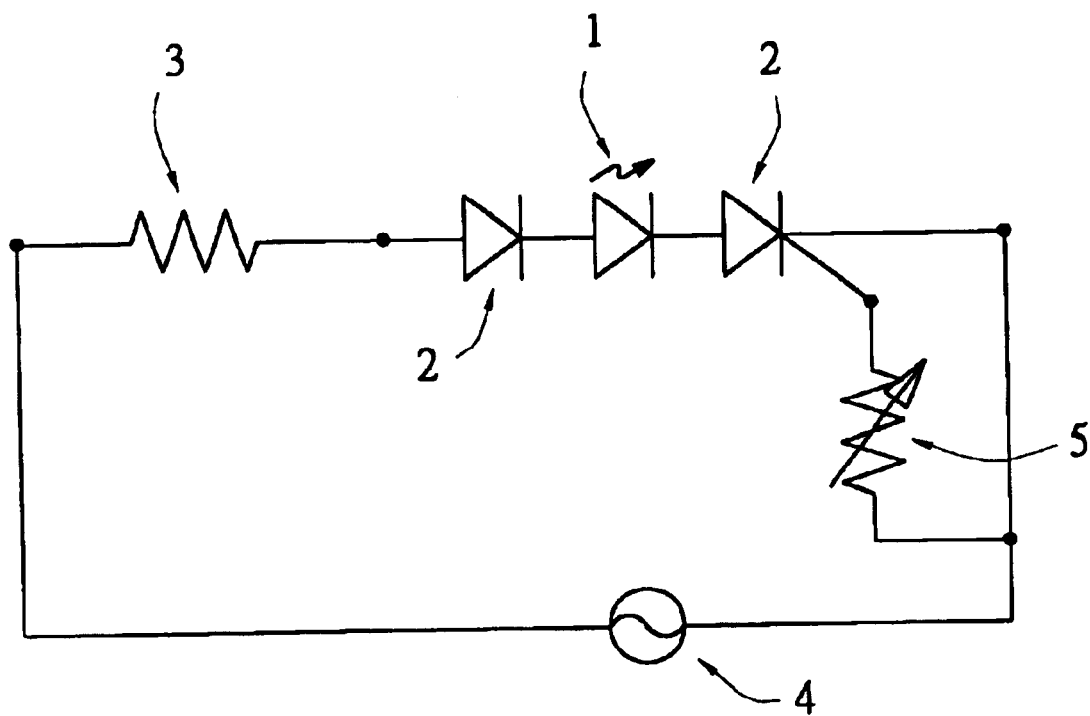
FIG. 4 is similar to FIG. 3 but showing another application of the LED packaging structure of the present invention.

Also referring to FIG. 4, if desired, a variable resistor 5 can be connected to the LED packaging structure of the present invention. The variable resistor 5 functions to adjust electrical current flowing through the LED 1 whereby illumination of the LED 1 is made adjustable.

Figure 5:
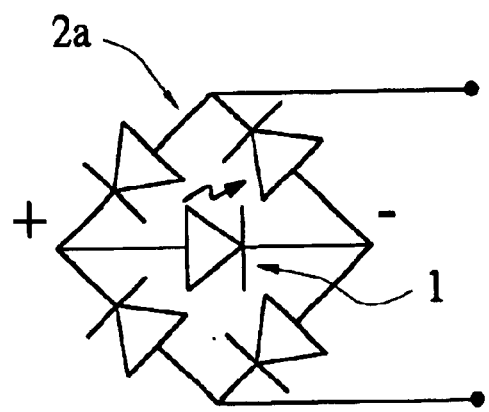
FIG. 5 shows another rectification circuit of the LED packaging structure of the present invention.

Also referring to FIG. 5, a different rectification device, formed of a bridge circuit 2a, is also applicable in the present invention. The rectification circuit 2a is comprised of four diodes connected to the LED 1 in a conventional bridge configuration. The bridge circuit is well known in the art of electronics and electronics and thus no further detail is needed herein.

Figure 6:
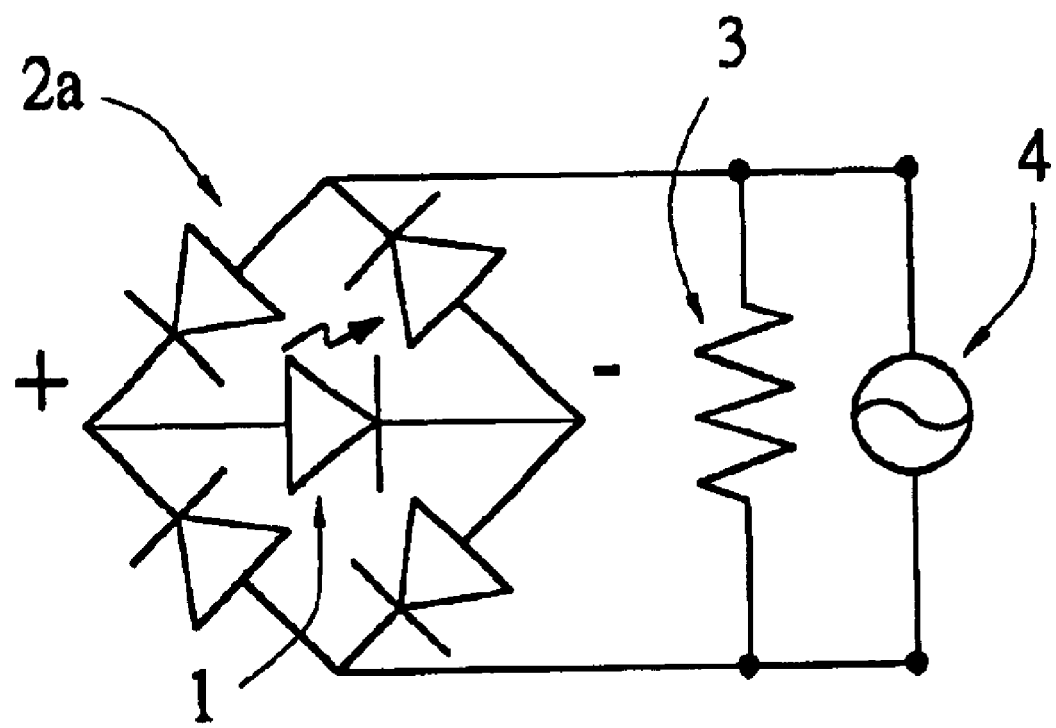
FIG. 6 shows a circuit diagram of a further application of the LED packaging structure of the present invention.

Also referring to FIG. 6, in a practical application, a resistor 3 is connected between the bridge circuit 2a and the electrical main 4 for regulation of electrical current flowing through the LED 1 that constitutes in part the bridge circuit 2a Thus, the LED 1 that is comprised of the bridge rectification circuit 2a can be directly connected to the electrical main 4 wherein the rectification circuit 2a, together with the resistor 3, receives and converts the alternate current from the electrical main 4 into the direct current for the LED 1 to power and light the light-emitting chip 13 of the LED 1.

Figure 7:
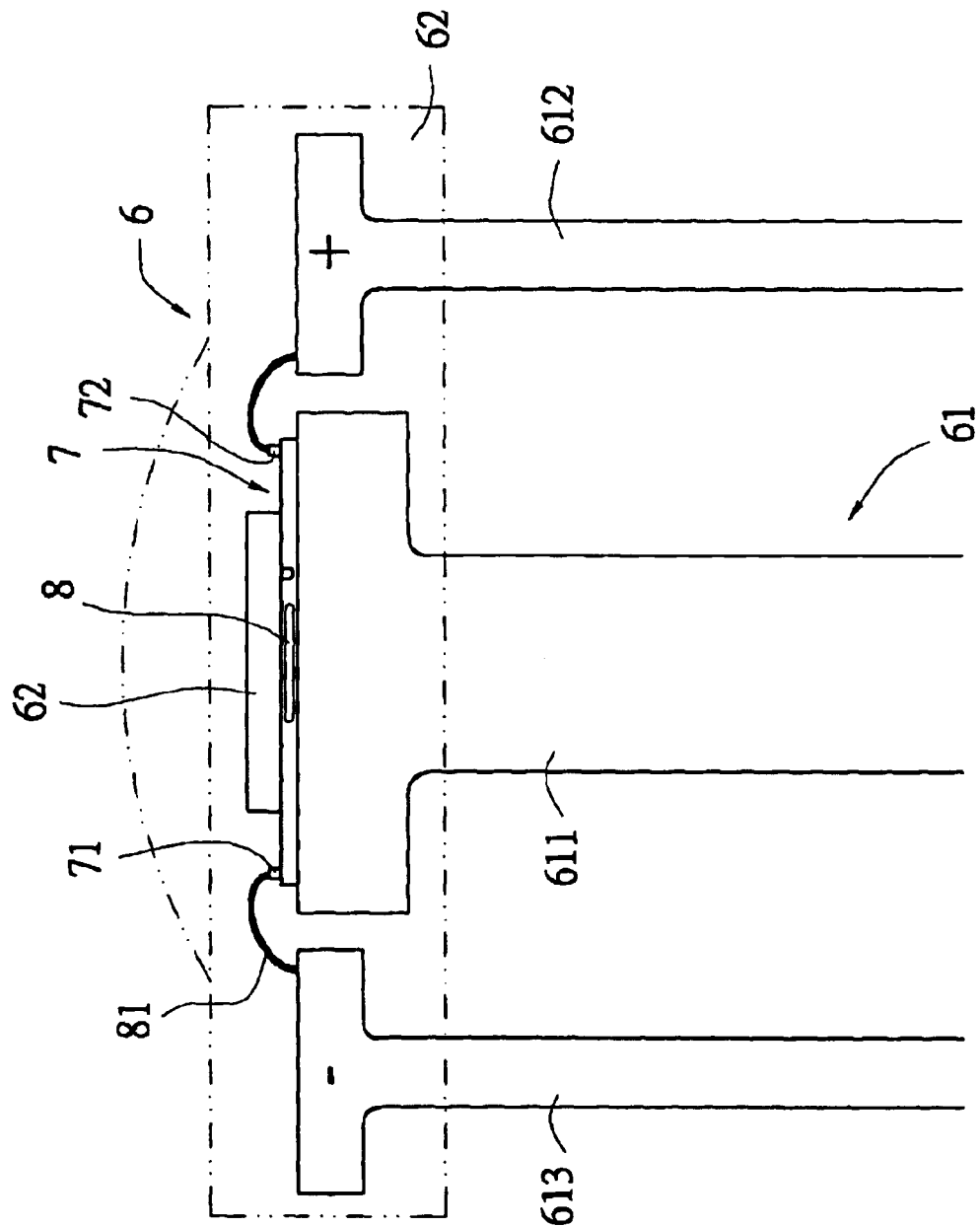
FIG. 7 schematically shows another embodiment of the LED packaging structure in accordance with the present invention.
Figure 8:
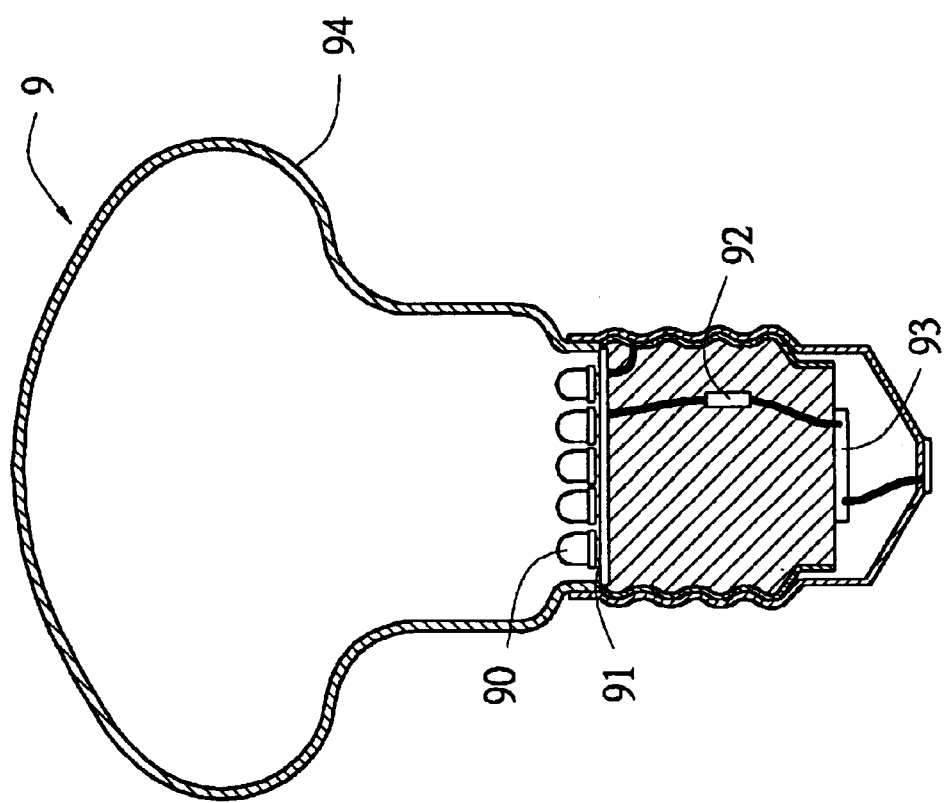
FIG. 8 is a cross-sectional view of a lighting device comprised of conventional LEDs.
Figure 9:
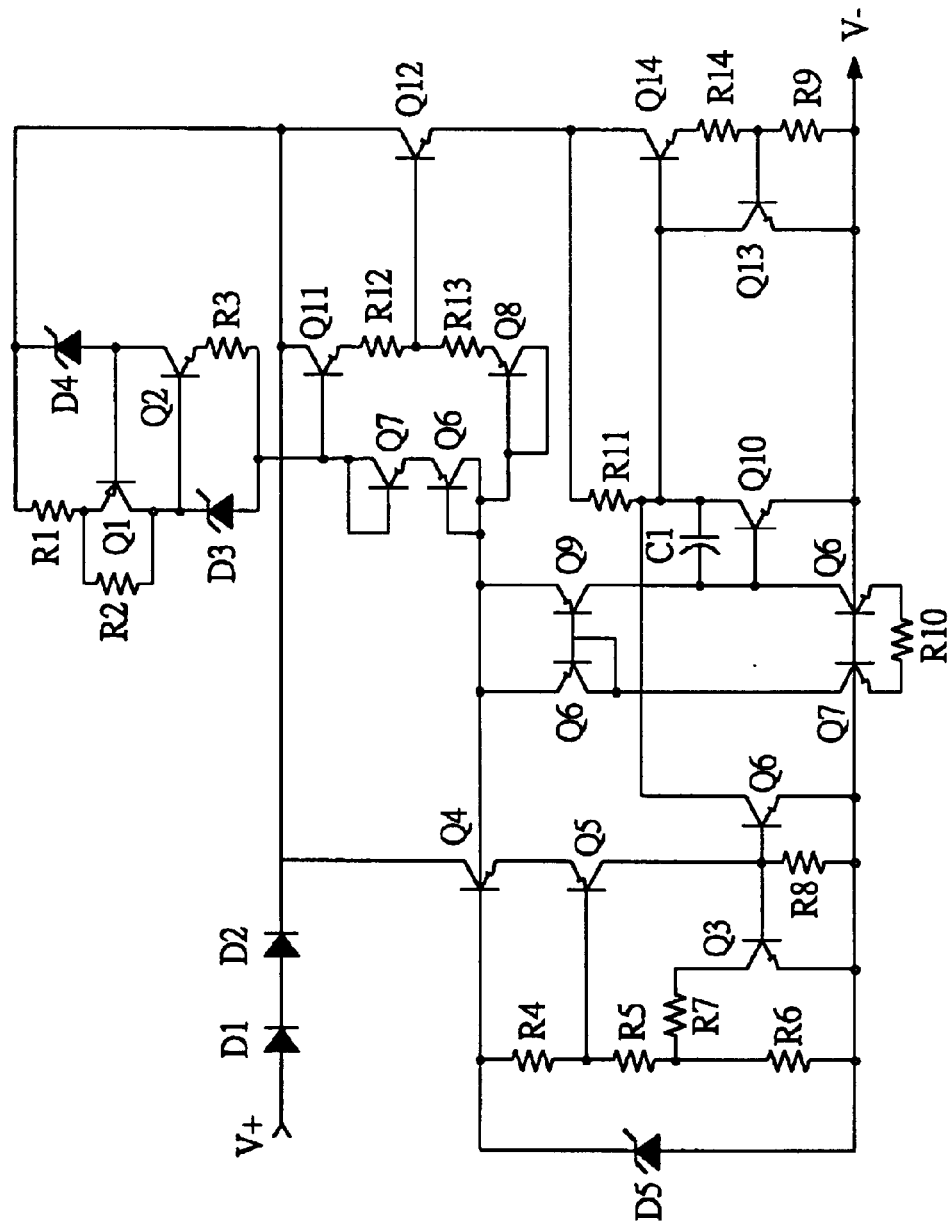
FIG. 9 is an illustrative example of a circuit employed in the lighting device comprised of the conventional LEDs.

Referring to FIG. 7, another embodiment of the LED packaging structure of the present invention is shown, wherein an LED 6 comprises a frame 61 and a packaging portion 62 wrapping a portion of the frame 61. The frame 61 is comprised of a primary support 611 and first and second subsidiary supports 612, 613 located on opposite sides of the primary support 611. A substrate 7 having pre-defined positive and negative electrodes 71, 72 is formed on the primary support 611 and a light-emitting chip 62 having positive and negative poles is formed on the substrate 7 with the positive and negative poles of the light-emitting chip 62 respectively corresponding to and connected to the positive and negative electrodes 71, 72 of the substrate 7. The light-emitting chip 62 is generally powered with 110 volts and the rating voltage of the LED is 100–107V.

A rectification circuit 8is built in the LED 6. The rectification circuit 8 is comprised of diodes that are low power, high voltage diodes. For example, the diodes are what can be operated with 10–50 mA and Vf=0.1–0.7V and Vr=250V. The diodes are formed on the substrate 7 and the substrate 7 is connected to the first and second subsidiary supports 612, 613 that function as positive and negative external contacts by leads 81. The rectification circuit 8 can be comprised of a bridge rectification circuit. Thus, the LED 6 comprises a built-in rectification circuit 8 wherein the rectification circuit 8 receives and converts an alternate current from the electrical main into a direct current that is applied to the light-emitting chip 62 of the LED 6. Therefore, the LED device of the present invention can be directly connected to the electrical main and powered thereby without additional rectification device.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light emitting diode packaging structure comprising:

a light emitting diode comprising a frame and a packaging portion packaging a portion of the frame, the frame comprising a primary support and first and second subsidiary supports on opposite sides of the primary support, a light-emitting chip having positive and negative poles being formed on the primary support; and a rectification circuit comprised of diodes of low power high voltage construction, the diodes being formed on the first and second subsidiary supports respectively and electrically connected to the positive and negative poles of the light-emitting chip by leads.

2. The light emitting diode packaging structure as claimed in claim 1, wherein the rectification circuit comprises a bridge circuit.

3. A light emitting diode packaging structure comprising:

a light emitting diode comprising a frame and a packaging portion packaging a portion of the frame, the frame comprising a primary support and first and second subsidiary supports on opposite sides of the primary support, a substrate having pre-defined positive and negative electrodes being formed on the primary support and a light-emitting chip having positive and negative poles being formed on the substrate with the positive and negative poles of the light-emitting chip corresponding to and connected to the positive and negative electrodes of the substrate; and a rectification circuit comprised of diodes of low power high voltage construction,the diodes being formed on the substrate and electrically connected to the first and second subsidiary supports respectively by leads.

4. The light emitting diode packaging structure as claimed in claim 3, wherein the rectification circuit comprises a bridge circuit.

* * * * *